(12) United States Patent
Mostoller et al.

(10) Patent No.: US 11,095,248 B2
(45) Date of Patent: Aug. 17, 2021

(54) SOLAR JUNCTION BOX

(71) Applicant: TE CONNECTIVITY CORPORATION, Berwyn, PA (US)

(72) Inventors: Matthew Edward Mostoller, Hummelstown, PA (US); Christopher George Daily, Harrisburg, PA (US)

(73) Assignee: TE CONNECTIVITY SERVICES GmbH, Schaffhausen (CH)

( * ) Notice: Subject to any disclaimer, the term of this patent is extended or adjusted under 35 U.S.C. 154(b) by 328 days.

(21) Appl. No.: 15/827,489

(22) Filed: Nov. 30, 2017

(65) Prior Publication Data
US 2019/0165728 A1 May 30, 2019

(51) Int. Cl.
*H02S 40/34* (2014.01)
*H01L 31/02* (2006.01)
*H01L 31/044* (2014.01)

(52) U.S. Cl.
CPC ........ *H02S 40/34* (2014.12); *H01L 31/02013* (2013.01); *H01L 31/02021* (2013.01); *H01L 31/044* (2014.12)

(58) Field of Classification Search
CPC ............... H02S 40/34; H01L 31/02013; H01L 31/02021; H01L 31/044
See application file for complete search history.

(56) References Cited

U.S. PATENT DOCUMENTS 4,460,232 A * 7/1984 Sotolongo ............ H01R 13/501
439/523
2010/0139760 A1 * 6/2010 Giefers ................ H01R 9/2416
136/256

FOREIGN PATENT DOCUMENTS

| DE | 10 2004 025627 A1 | 12/2005 |
| EP | 2058867 A2 | 5/2009 |
| WO | 2009 / 129405 A2 | 10/2009 |

OTHER PUBLICATIONS

International Search Report, Application No. PCT/IB2018/059468, International Filing Date, Nov. 29, 2018.

* cited by examiner

*Primary Examiner* — Golam Mowla (57) ABSTRACT

A solar junction box for a solar panel having at least one photovoltaic cell and a foil electrically connected to the at least one cell including a housing having a base and a cover coupled to the base. The base and the cover define a cavity. The base has a mounting wall including a mounting surface configured to be mounted to the solar panel including a foil opening at the mounting surface. A contact assembly is received in the cavity having a terminal including a foil contact configured to be terminated to the foil. The foil contact has a transition leg transitioning into the foil opening to interface with the foil and a mating leg configured to be mated with the foil. The mating leg extends at or beyond the mounting wall.

20 Claims, 6 Drawing Sheets

SOLAR JUNCTION BOX

BACKGROUND OF THE INVENTION

The subject matter herein relates generally to solar junction boxes for solar panels.

Photovoltaic (PV) modules or arrays, such as solar panels, produce electricity from solar energy. Electrical power produced by PV modules reduces the amount of energy required from non-renewable resources such as fossil fuels and nuclear energy. Significant environmental benefits are also realized from solar energy production, for example, reduction in air pollution from burning fossil fuels, reduction in water and land use from power generation plants, and reduction in the storage of waste byproducts. Solar energy produces no noise, and has few moving components. Because of their reliability, PV modules also reduce the cost of residential and commercial power to consumers.

PV cells are essentially large-area semiconductor diodes. Due to the photovoltaic effect, the energy of photons is converted into electrical power within a PV cell when the PV cell is irradiated by a light source such as sunlight. PV cells are typically interconnected into solar modules that have power ranges of up to 100 watts or greater. For large PV systems, special PV modules are produced with typical power range of up to several 100 W. A photovoltaic module is the basic element of a photovoltaic power generation system. A PV module has many solar cells interconnected in series or parallel, according to the desired voltage and current parameters. PV cells are connected in series with thin contacts, such as a foil. The foil is terminated to terminals in a junction box, which may electrically connect groups of the PV cells and/or solar panels.

The junction box is typically connected to the back side of the solar panel, such as to a back sheet of the solar panel. The foil is terminated to a corresponding terminal in the junction box. Typically, an exposed end of the foil is manipulated and formed to extend into the junction box and then wrapped around a terminal and secured thereto by a clip or welding. Manipulation of the foil may damage the foil. For example, bending and moving of the foil may cause fracturing of the foil which can lead to long term reliability issues. The foil is typically formed into a three-dimensional shape, such as I-shaped or U-shaped for interfacing with the terminal in the junction box. The forming of the foils is time consuming and may be difficult due to limited accessibility in the solar junction box. Additionally, manipulation of tools in the solar junction box, such as for welding may be difficult doe to the space constraints.

A need remains for a solar junction box that may be terminated to a foil of a solar panel in an effective and reliable manner.

BRIEF DESCRIPTION OF THE INVENTION

In one embodiment, a solar junction box is provided for a solar panel having at least one photovoltaic cell and a foil electrically connected to the at least one cell including a housing having a base and a cover coupled to the base. The base and the cover define a cavity. The base has a mounting wall including a mounting surface configured to be mounted to the solar panel including a foil opening at the mounting surface. A contact assembly is received in the cavity having a terminal including a foil contact configured to be terminated to the foil. The foil contact has a transition leg transitioning into the foil opening to interface with the foil and a mating leg configured to be mated with the foil. The mating leg extends at or beyond the mounting wall.

In a further embodiment, a solar junction box is provided for a solar panel having at least one photovoltaic cell and a foil electrically connected to the at least one cell including a housing having a base and a cover coupled to the base. The base and the cover define a cavity. The base has a mounting wall including a mounting surface configured to be mounted to the solar panel including a foil opening at the mounting surface. A contact assembly is received in the cavity. The contact assembly includes a first terminal, a second terminal and a protection device electrically connected between the first and second terminals. The first terminal includes a foil contact configured to be terminated to the foil having a transition leg transitioning into the foil opening to interface with the foil. The foil contact has a mating leg configured to be mated with the foil and being positioned at or beyond the mounting wall.

In another embodiment, a solar junction box is provided for a solar panel having at least one photovoltaic cell and a foil electrically connected to the at least one cell including a housing having a base and a cover coupled to the base. The base and the cover define a cavity. The base has a mounting wall including a mounting surface configured to be mounted to the solar panel including a foil opening at the mounting surface. A contact assembly is received in the cavity having a terminal including a foil contact configured to be terminated to the foil. The foil contact has a transition leg transitioning into the foil opening to interface with the foil and a mating leg configured to be mated with the foil. The mating leg extends into the panel opening in the panel for termination to the foil.

DETAILED DESCRIPTION OF THE INVENTION

Figure 1:
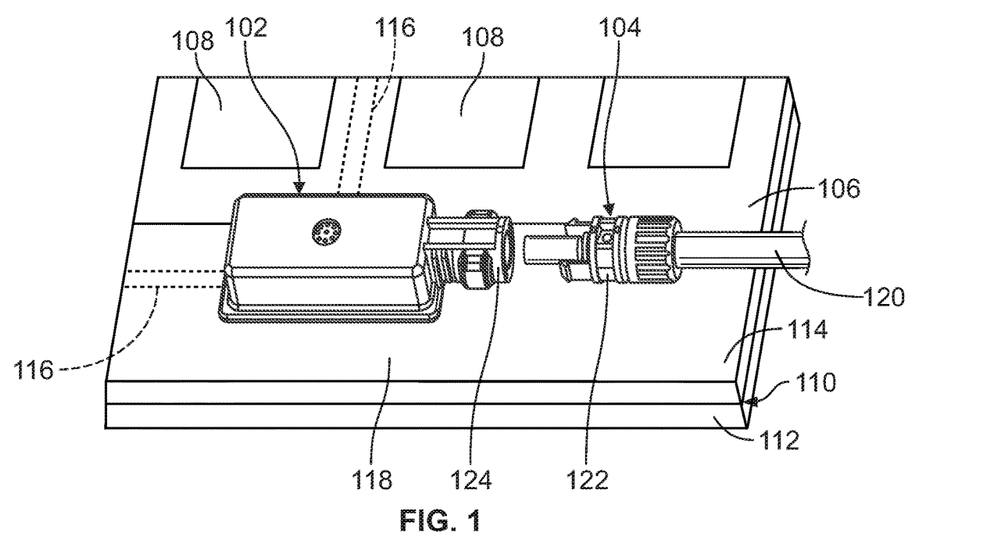
FIG. 1 illustrates a photovoltaic (PV) system including a solar junction box formed in accordance with an exemplary embodiment.

FIG. 1 illustrates a photovoltaic (PV) system 100 formed in accordance with an exemplary embodiment. The PV system 100 includes one or more solar junction boxes 102, which may be electrically connected by connector assemblies 104 (e.g., cable connector assemblies). The PV system 100 includes a plurality of PV components 106. In an exemplary embodiment, the PV components 106 may be any type of PV components, such as PV modules or arrays that are used to generate electricity, such as solar panels, or other PV components used within the PV system 100 such as power storage devices, sensors, controllers, and the like. In the illustrated embodiment, the PV components 106 are solar panels and may be referred to hereinafter as solar panels 106. The solar panels 106 have a plurality of PV cells 108 configured to generate electricity.

The connector assemblies 104 may be coupled to solar junction boxes 102 of the same solar panel 106 or solar junction boxes 102 of different solar panels 106. The connector assemblies 104 transmit power and/or data along the transmission path between the PV components 106. The connector assemblies 104 may include cables 120 and/or connectors, such as plugs 122 at ends of the cables 120. The plug 122 may be coupled to a plug boss 124 of the solar junction box 102.

In an exemplary embodiment, the solar panel 106 includes a semiconductor layer 110 sandwiched between a glass layer 112 and a back sheet 114. The semiconductor layer 110 includes the cells 108 and conductors, such as conductive foils 116, connecting the cells 108 in series. Groups of the cells 108 may be electrically connected to the corresponding solar junction box 102. For example, the foil 116 may be terminated to a corresponding terminal in the solar junction box 102. The solar junction boxes 102 may be mounted to the back sheet 114 of the solar panel 106 at any location, such as at or near an edge of the solar panel 106, remote from the edge, near a center of the solar panel 106, or elsewhere. Optionally, the solar junction boxes 102 may be mounted at predetermined mounting locations, which may be located at a predetermined distance from the edge(s) and/or from the corner(s) of the solar panel 106. The foils 116 may extend through the back sheet 114 into the solar junction boxes 102. Optionally, the foils 116 may extend from the edge to the solar junction box 102. The foils 116 may be routed along an exterior 118 of the back sheet 114, such as for termination to the solar junction box 102.

The glass layer 112 is positioned above the semiconductor layer 110 and allows sunlight to pass therethrough to the cells 108. The back sheet 114 is positioned below the semiconductor layer 110. The back sheet 114 may be a plastic layer. Alternatively, the back sheet 114 may be manufactured from another material. For example, the back sheet 114 may be another glass layer. For example, in some various embodiments, the solar panel 106 may be a bifacial solar panel configured to receive sunlight from both sides of the solar panel 106. For example, the backside (back sheet 114) may receive reflective sunlight. Each foil 116 extends along a foil axis, which is generally the longitudinal axis of the foil 116. The foil 116 may be routed in any direction along the solar panel 106, such as up the panel, down the panel, side-to-side across the panel, transverse across the panel, longitudinally, laterally, or otherwise. The foil axis may be parallel to one of the edges; however the foil axis may be transverse to the edges in alternative embodiments. Additionally, different foils 116 may be routed in different directions.

While FIG. 1 is a bottom perspective view showing the solar junction box 102 mounted to the back sheet 114, in use, the glass layer 112 would be on top or upward facing to face the sun and the solar junction box 102 would be mounted to the backside of the solar panel 106. Other orientations are possible and terms denoting orientation (e.g., top, bottom, up, down, etc.) may be relative to the orientation shown in the particular Figure as opposed to an orientation in use.

Figure 2:
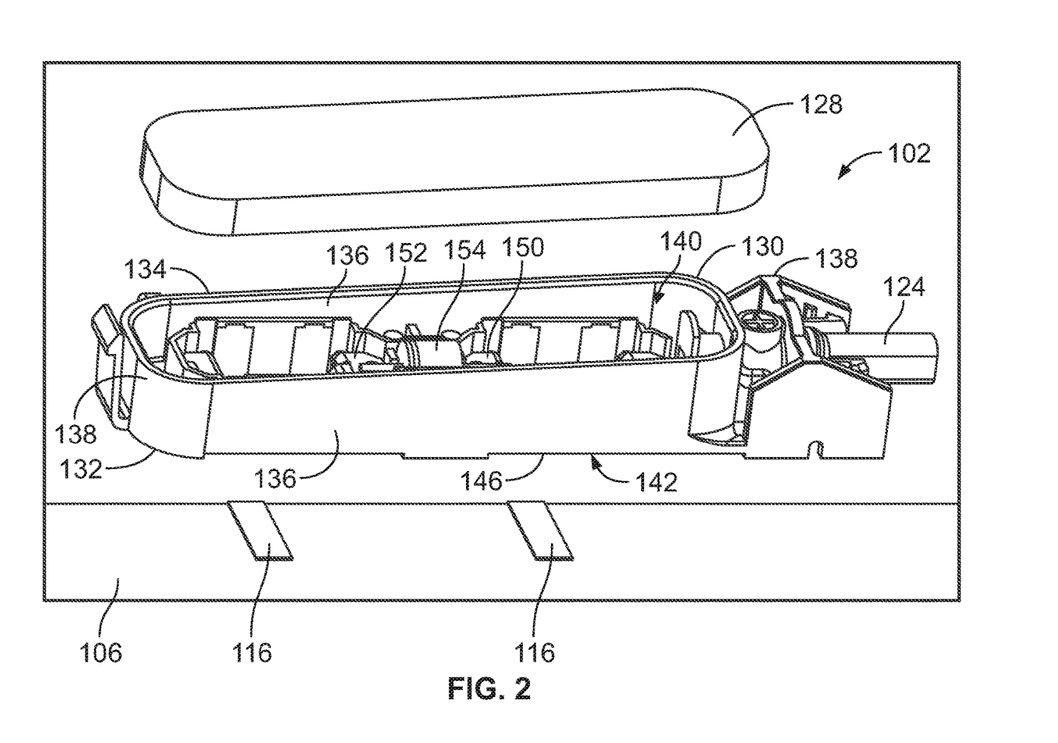
FIG. 2 is a partially exploded view of the solar junction box formed in accordance with an exemplary embodiment.
Figure 3:
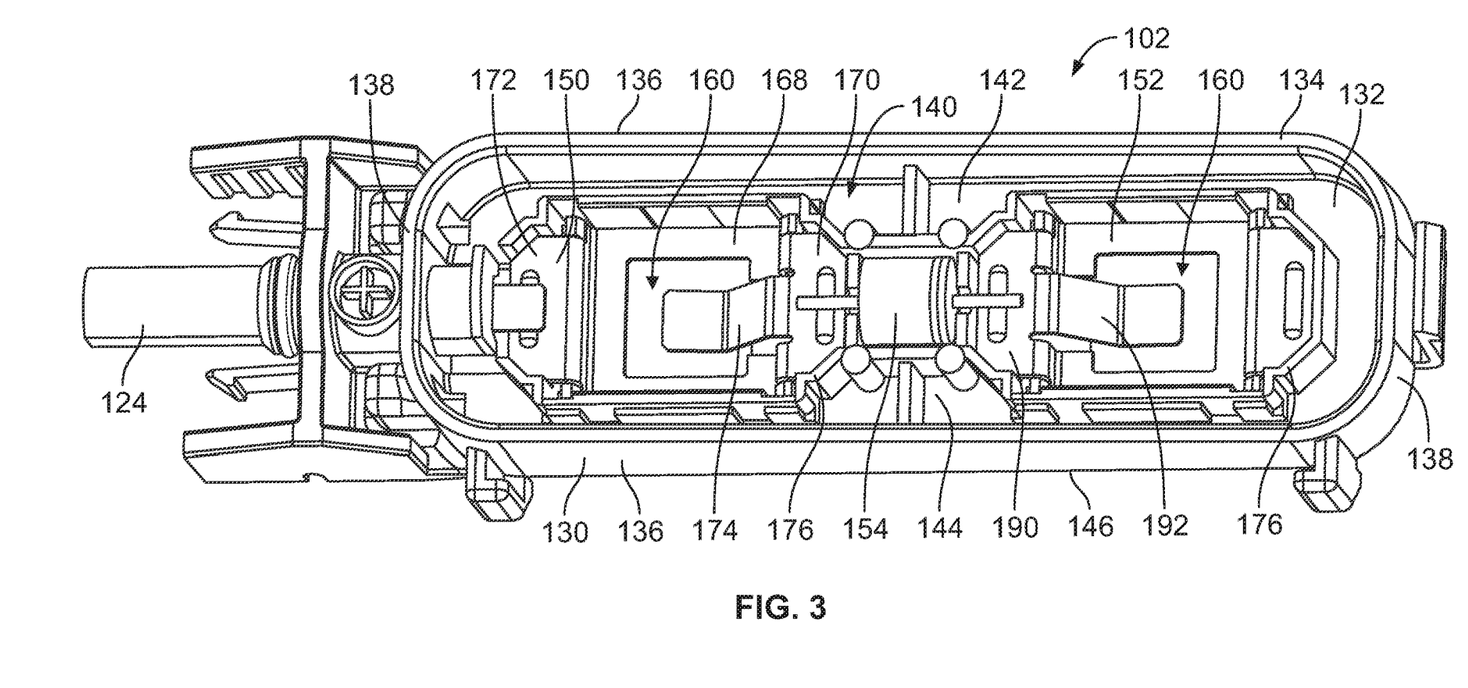
FIG. 3 is a perspective view of a portion of the solar junction box in accordance with an exemplary embodiment.

FIG. 2 is a partially exploded view of the solar junction box 102 formed in accordance with an exemplary embodiment. FIG. 3 is a perspective view of a portion of the solar junction box 102. The solar junction box 102 includes a lid or cover 128 configured to be coupled to a housing 130, which is configured to be mounted to the solar panel 106. The housing 130 may include the plug boss 124 extending therefrom.

The housing 130 includes a base 132 and a plurality of walls 134 extending from the base 132. Any number of walls 134 may be provided to provide an appropriate shaped housing for the particular application. In the illustrated embodiment, the walls 134 include side walls 136 and end walls 138 extending between the side walls 136. Optionally, the housing 130 may have a generally rectangular cross section, being long and narrow, with the side walls 136 longer than the end walls 138. Other shapes are possible in alternative embodiments.

The side walls 136 and end walls 138 define a cavity 140. The cover 128 covers the cavity 140 and electrical components. In an exemplary embodiment, the base 132 includes a mounting wall 142 having an inner surface 144 facing and defining a portion of the cavity 140. The mounting wall 142 includes a mounting surface 146 configured to be mounted to the solar panel 106. The solar junction box 102 holds electrical components configured to be electrically connected to one or more of the foils 116 in the cavity 140. The mounting surface 146 may be mounted directly to the solar panel 106. For example, adhesive or epoxy (e.g., double sided tape) may be used to either temporarily or permanently secure the mounting surface 146 to the solar panel 106. Optionally, the cover 128 may be secured to and sealed to the housing 130. Alternatively, the cover 128 may be directly mounted to the solar panel 106 and may be sealed to the solar panel 106, such as by silicon or epoxy.

In an exemplary embodiment, the solar junction box 102 includes first and second terminals 150, 152 in the cavity 140. At least one of the terminals 150, 152 is configured to be coupled to the cable 120. Optionally, the first terminal 150 may be a positive terminal and the second terminal 152 may be a negative terminal, or vice versa. In an exemplary embodiment, the solar junction box 102 includes a protection device 154 electrically connected to the terminals 150, 152. The first terminal 150 is terminated to a corresponding foil 116 and the second terminal 152 is terminated to a corresponding foil 116.

The protection device 154 may be used to bypass or isolate the solar circuit. For example, the protection device 154 may allow power flow in one direction and restrict power flow in an opposite direction. Optionally, the protection device 154 may limit power flow in a direction from the solar cell 106 and restrict power flow back into the solar cell 106 in certain circumstances. For example, when the solar cell 106 is shaded or damaged and not producing electricity, the protection device 154 may block reverse flow of electricity through the system back to the cells 108, which may cause damage to the cells 108. The protection device 154, as in the illustrated embodiment, may be a bypass diode and may referred to hereinafter as bypass diode 154; however the protection device 154 is not limited to a bypass diode. Other types of protection devices 154 may be used in alternative embodiments. For example, the protection device 154 may be a circuit assembly including a circuit board and other components that protect the system. The protection device 154 may be an isolator to isolate the terminals 150, 152. The protection device may be a MOSFET. The protection device 154 may include a microprocessor or other component to control and/or monitor the system. Optionally, the bypass diode 154 may be positioned between the terminals 150, 152. The solar junction box 102 may include other electrical components in alternative embodiments.

The terminals 150, 152 are positioned near corresponding foil openings 160 in the base 132. The foil openings 160 pass through the mounting wall 142 between the inner surface 144 and the mounting surface 146. The foil openings 160 are configured to be aligned with corresponding foils 116. Portions of the solar panel 106 are exposed through the foil openings 160. Optionally, the mounting surface 146 may be sealed to the solar panel 106 around the foil openings 160.

In an exemplary embodiment, the first terminal 150 is mounted within the cavity 140 and is configured to be electrically connected to the positive foil 116 (or negative foil), the protection device 154 and to the electrical cable 120. The first terminal 150 includes a main body 168. In an exemplary embodiment, the first terminal 150 includes a protection device contact 170 extending from the main body 168 configured to be terminated to the protection device 154. Optionally, the protection device 154 may be soldered to the protection device contact 170; however other types of termination may be utilized in alternative embodiments. In an exemplary embodiment, the first terminal 150 includes a terminating contact 172 configured to be terminated to the cable 120. Optionally, the terminating contact 172 may be soldered to a terminal or directly to the cable 120; however other types of termination may be utilized in alternative embodiments, such as crimping, IDC connection, and the like. The first terminal 150 includes a foil contact 174 configured to be terminated to the foil 116. Optionally, the foil contact 174 may be soldered or welded to the foil 116; however other types of termination may be utilized in alternative embodiments. The terminal 150 may include intermediate segments extending between the protection device contact 170, terminating contact 172 and/or foil contact 174. In an exemplary embodiment, the first terminal 150 is a stamped and formed terminal having the protection device contact 170, the terminating contact 172 and the foil contact 174 stamped and formed with the main body 168.

Optionally, the base 132 includes alignment lugs 176. The terminal 150 may be mounted to and/or aligned relative to the base 132 by the corresponding lug 176. The terminal 150 may be secured to the base 132 using fasteners, adhesive, interference fit, latches, heat staked posts, or other securing features (e.g., to prevent lift off). The protection device 154 may be mounted to and/or aligned relative to the base 132 by the lugs 176. The cover 128 may be aligned relative to the base 132 by the lugs 176.

The second terminal 152 may be similar to or identical to the first terminal 150. The second terminal 152 is mounted within the cavity 140 and is configured to be electrically connected to the negative foil 116 (or the positive foil) and the protection device 154. In an exemplary embodiment, the second terminal 152 includes a protection device contact 190 configured to be terminated to the protection device 154. The second terminal 152 includes a foil contact 192 configured to be terminated to the foil 116. The second terminal 152 may include another type of contact, such as a terminating contact, such as for termination to a cable or other component. The terminal 152 may include intermediate segments extending between the protection device contact 190 and the foil contact 192.

Figure 4:
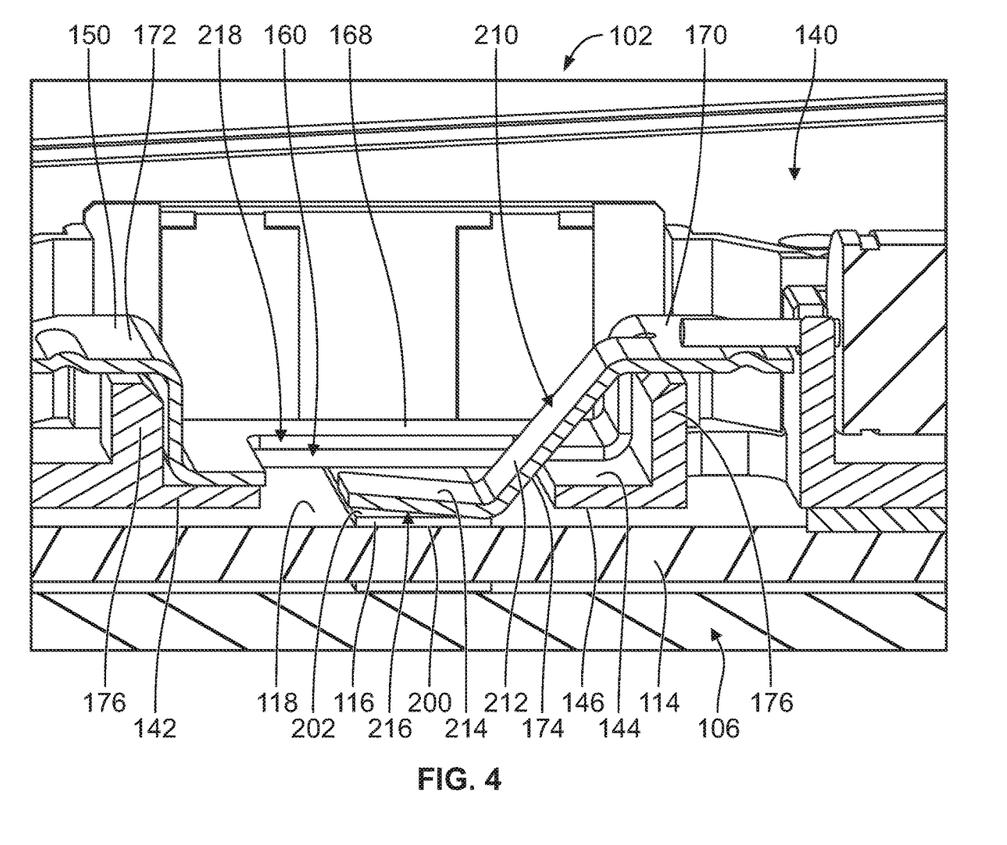
FIG. 4 is a partial sectional view of a portion of the solar junction box in accordance with an exemplary embodiment.

FIG. 4 is a partial sectional view of a portion of the solar junction box 102 in accordance with an exemplary embodiment. In the illustrated embodiment, the main body 168 of the first terminal 150 is positioned in the cavity 140. For example, the main body 168 extends along the inner surface 144 of the mounting wall 142. Optionally, the main body 168 may be U-shaped having a horizontal portion extending along the inner surface 144 and vertical portions extending along corresponding alignment lugs 176. The protection device contact 170 extends from the main body 168 along a corresponding alignment lug 176 and the terminating contact 172 extends from the main body 168 along the corresponding alignment lug 176.

The foil contact 174 extends from the main body 168 and is configured to be terminated to the foil 116. In the illustrated embodiment, the foil 116 extends along the exterior 118 of the back sheet 114. The foil opening 160 is aligned with the foil 116. The foil 116 is exposed through the foil opening 160. The exterior 118 of the back sheet 114 is exposed through the foil opening 160. In an exemplary embodiment, the foil contact 174 extends into and at least partially through the mounting wall 142 at the foil opening 160 for termination to the foil 116. In an exemplary embodiment, the foil contact 174 may be welded to the foil 116 through the cavity 140. A back side 200 of the foil 116 engages and is backed up by the back sheet 114 and a front side 202 of the foil 116 is exposed for termination to the foil contact 174.

In an exemplary embodiment, the foil contact 174 includes a spring beam 210 extending from the main body 168 to engage the foil 116. The spring beam 210 may be spring biased against the foil 116. When the solar junction box 102 is mounted to the solar panel 106, the spring beam 210 may be at least partially deflected against the foil 116 thus imparting a spring force against the foil 116 to hold the foil contact 174 against the foil 116. In an exemplary embodiment, the foil contact 174 includes a transition leg 212 transitioning into the foil opening 160 to interface with the foil 116. The foil contact 174 has a mating leg 214 extending from the transition leg 212. The mating leg 214 is configured to be mated with the foil 116. In an exemplary embodiment, the mating leg 214 includes a weld pad 216 configured to be welded to the foil 116. The transition leg 212 and/or the mating leg 214 may define the spring beam 210.

In an exemplary embodiment, the mating leg 214 is positioned at or beyond the mounting wall 142. For example, the mating leg 214 and/or the transition leg 212 extend beyond the inner surface 144. Optionally, the mating leg 214 and/or the transition leg 212 may extend beyond the mounting surface 146. The mating leg 214 is positioned outside of the cavity 140 for interfacing with the foil 116, which is outside of the cavity 140. In the illustrated embodiment, the transition leg 212 extends from the main body 168 proximate to the protection device contact 170, such as near an edge of one of the alignment lug 176. The transition leg 212 extends through an opening 218 in the main body 168 to locate the mating leg 214 and the foil opening 160. The mating leg 214 is positioned beyond the main body 168.

Figure 5:
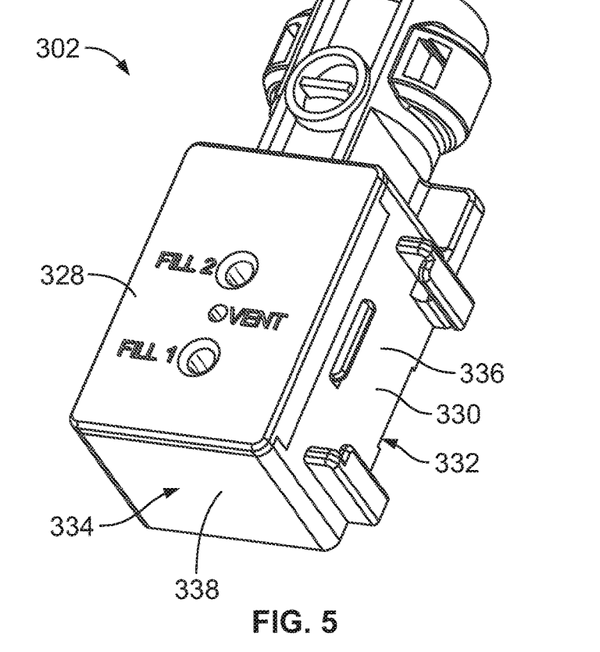
FIG. 5 is a perspective view of a solar junction box formed in accordance with an exemplary embodiment.
Figure 6:
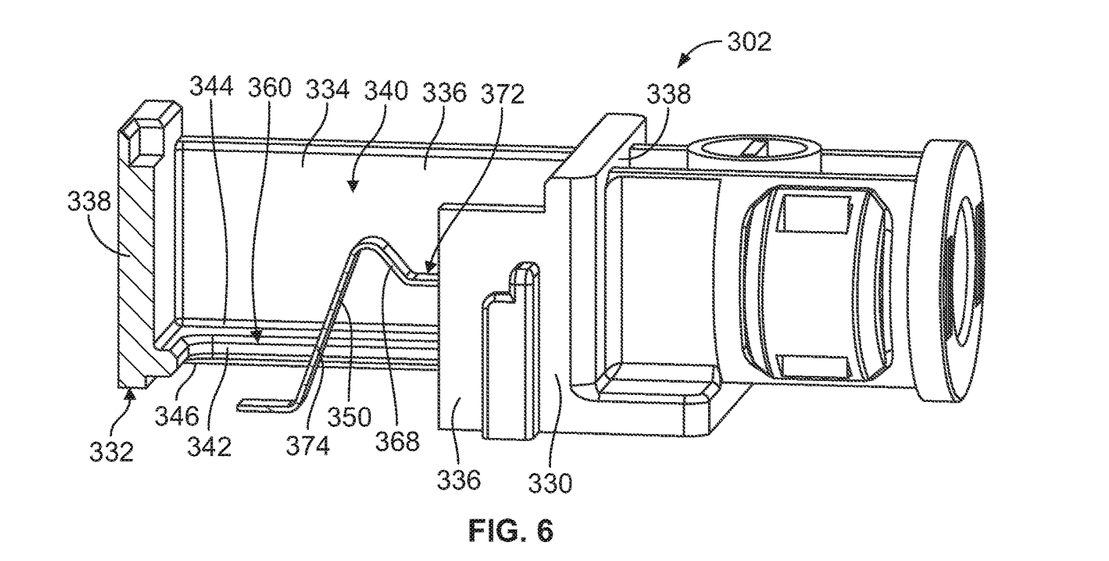
FIG. 6 is a partial sectional view of a portion of the solar junction box in accordance with an exemplary embodiment.

FIG. 5 is a perspective view of a solar junction box 302 formed in accordance with an exemplary embodiment. FIG. 6 is a partial sectional view of a portion of the solar junction box 302. The solar junction box 302 may be similar to the solar junction box 102 and may be used as part of the PV system 100 (shown in FIG. 1). The solar junction box 302 may be mounted to the solar panel 106 for electrical connection to the foil 116. The solar junction box 302 includes a lid or cover 328 (FIG. 5) configured to be coupled to a housing 330, which is configured to be mounted to the solar panel 106.

The housing 330 includes a base 332 and a plurality of walls 334 extending from the base 332. Any number of walls 334 may be provided to provide an appropriate shaped housing for the particular application. In the illustrated embodiment, the walls 334 include side walls 336 and end walls 338 extending between the side walls 336. Optionally, the housing 330 may have a generally rectangular cross section, being long and narrow, with the side walls 336 longer than the end walls 338. Other shapes are possible in alternative embodiments.

The side walls 336 and end walls 338 define a cavity 340 (FIG. 6). The cover 328 covers the cavity 340 and electrical components. In an exemplary embodiment, the base 332 includes a mounting wall 342 having an inner surface 344 facing and defining a portion of the cavity 340. The mounting wall 342 includes a mounting surface 346 configured to be mounted to the solar panel 106. The solar junction box 302 holds electrical components configured to be electrically connected to one or more of the foils 116 in the cavity 340. The mounting surface 346 may be mounted directly to the solar panel 106. For example, adhesive or epoxy (e.g., double sided tape) may be used to either temporarily or permanently secure the mounting surface 346 to the solar panel 106. Optionally, the cover 328 may be secured to and sealed to the housing 330. Alternatively, the cover 328 may be directly mounted to the solar panel 106 and may be sealed to the solar panel 106, such as by silicon or epoxy.

In an exemplary embodiment, the solar junction box 302 includes a terminal 350 in the cavity 340. The terminal 350 is configured to be terminated to the corresponding foil 116. The terminal 350 is positioned near a foil opening 360 in the base 332. The foil opening 360 passes through the mounting wall 342 between the inner surface 344 and the mounting surface 346. The foil opening 360 is configured to be aligned with corresponding foil 116.

In an exemplary embodiment, the terminal 350 includes a main body 368. In an exemplary embodiment, the terminal 350 includes a terminating contact 372 configured to be terminated to the cable 120. The first terminal 350 includes a foil contact 374 configured to be terminated to the foil 116. Optionally, the foil contact 374 may be soldered or welded to the foil 116; however other types of termination may be utilized in alternative embodiments. In an exemplary embodiment, the terminal 350 is a stamped and formed terminal having the terminating contact 372 and the foil contact 374 stamped and formed with the main body 368.

Figure 7:
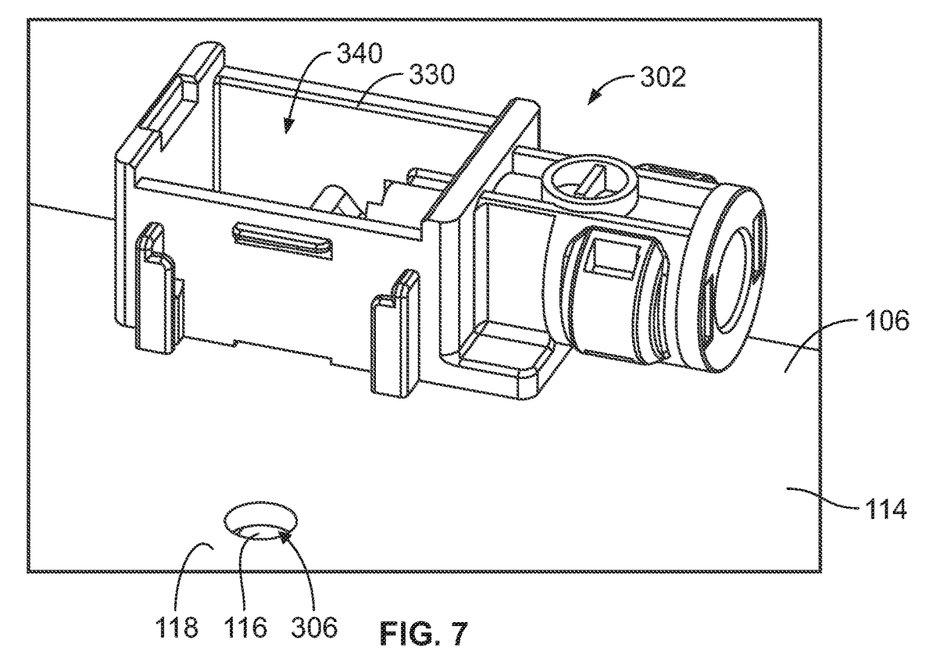
FIG. 7 illustrates the solar junction box poised for mounting to a solar panel.
Figure 8:
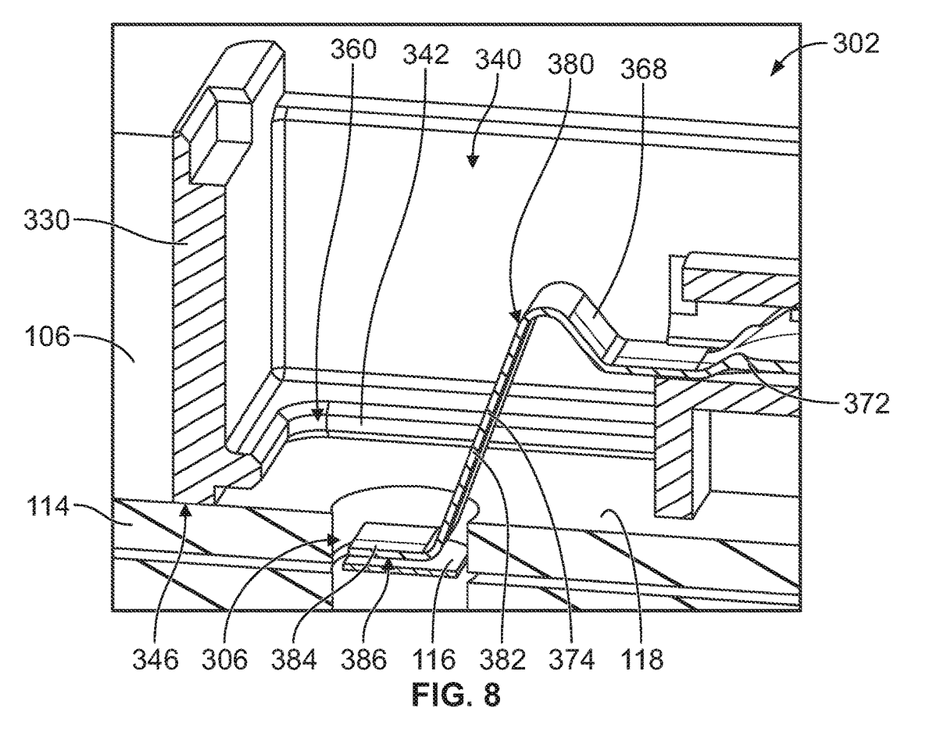
FIG. 8 is a partial sectional view of a portion of the solar junction box mounted to the solar panel in accordance with an exemplary embodiment.

FIG. 7 illustrates the solar junction box 302 poised for mounting to the solar panel 106. FIG. 8 is a partial sectional view of a portion of the solar junction box 302 mounted to the solar panel 106 in accordance with an exemplary embodiment. In the illustrated embodiment, the solar panel 106 includes a panel opening 306 in the back sheet 114. The panel opening 306 exposes a portion of the foil 116 through the panel opening 306. Rather than exposing a portion of the foil 116 exterior of the solar panel 106, the foil 116 may remain embedded interior of the solar panel 106. The foil 116 does not need to be manipulated or bent onto the exterior 118 of the back sheet 114 and/or into the solar junction box 302, but rather remains embedded interior of the solar panel 106. The foil contact 374 is configured to extend into the panel opening 306 to engage the exposed portion of the foil 116.

The foil contact 374 extends from the main body 368 and is configured to be terminated to the foil 116. The foil opening 360 is aligned with the foil 116 and the foil 116 is exposed through the foil opening 360. In an exemplary embodiment, the foil contact 374 extends into and at least partially through the mounting wall 342 at the foil opening 360 for termination to the foil 116. For example, the foil contact 374 extends exterior of the housing 330 into the panel opening 306 to engage the foil 116. In an exemplary embodiment, the foil contact 374 may be welded to the foil 116 through the cavity 340.

In an exemplary embodiment, the foil contact 374 includes a spring beam 380 extending from the main body 368 to engage the foil 116. The spring beam 380 may be spring biased against the foil 116. When the solar junction box 302 is mounted to the solar panel 106, the spring beam 380 may be at least partially deflected against the foil 116 thus imparting a spring force against the foil 116 to hold the foil contact 374 against the foil 116. In an exemplary embodiment, the foil contact 374 includes a transition leg 382 transitioning into the foil opening 360 to interface with the foil 116. The foil contact 374 has a mating leg 384 extending from the transition leg 382. The mating leg 384 is configured to be mated with the foil 116. In an exemplary embodiment, the mating leg 384 includes a weld pad 386 configured to be welded to the foil 116. The transition leg 382 and/or the mating leg 384 may define the spring beam 380.

In an exemplary embodiment, the mating leg 384 is positioned at or beyond the mounting wall 342. For example, the mating leg 384 and/or the transition leg 382 extend beyond the mounting wall 342 into the panel opening 306. In the illustrated embodiment, the mating leg 384 and the transition leg 382 extend beyond the mounting surface 346 and into the solar panel 106 for direct connection to the foil 116 within the solar panel 106. The mating leg 384 is positioned outside of the cavity 340 for interfacing with the foil 116, which is outside of the cavity 340.

Figure 9:
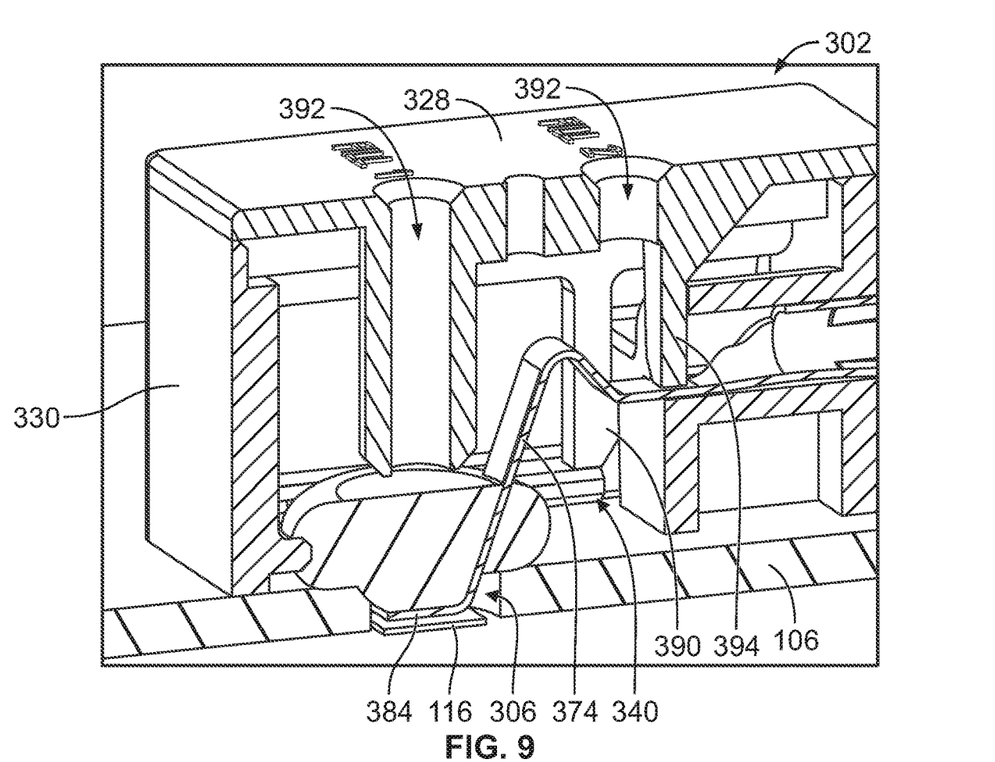
FIG. 9 is a partial sectional view of a portion of the solar junction box in accordance with an exemplary embodiment.

FIG. 9 is a partial sectional view of a portion of the solar junction box 302 showing the cover 328 coupled to the housing 330. The cover 328 includes latches 390 for securing the cover 328 to the housing 330. The cover 328 includes one or more openings 392 for receiving potting material. One of the openings 392 may be generally aligned with the foil contact 374, such as the mating leg 384 4 depositing potting material at the interface between the foil contact 374 and the foil 116. The potting material may seal the solar panel 106. For example, the potting material may seal the panel opening 306. Once the potting material is in place, additional potting material may be directed into the cavity 340 through another of the openings 392. In an exemplary embodiment, the cover 328 includes a potting dam 394 to block potting material from ingress into portions of the housing 330. For example, the potting dam 394 may close off the terminal channel that extends into the plug boss that receives the plug 122.

Figure 10:
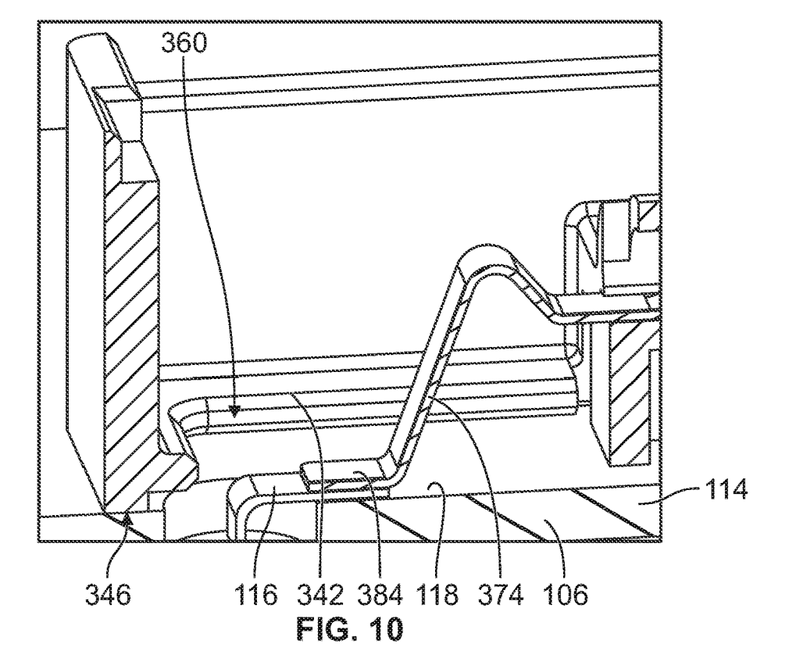
FIG. 10 is a partial sectional view of a portion of the solar junction box mounted to the solar panel in accordance with an exemplary embodiment.

FIG. 10 is a partial sectional view of a portion of the solar junction box 302 mounted to the solar panel 106 in accordance with an exemplary embodiment. FIG. 10 illustrates the foil 116 extending through the panel opening 306 to the exterior 118 of the back sheet 114. The foil 116 extends along the exterior 118 aligned with the foil opening 360. The foil contact 374 engages the foil 116 at the exterior 118 of the solar panel 106 for termination thereto. The foil contact 374 extends through the foil opening 360 in the mounting wall 342. In the illustrated embodiment, the mating leg 384 is generally coplanar with the mounting surface 346 for termination to the foil 116.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. § 112, sixth paragraph, unless and until such claim limitations expressly use the phrase "means for" followed by a statement of function void of further structure.

What is claimed is:

1. A solar junction box for a solar panel having at least one photovoltaic cell and a foil electrically connected to the at least one cell, the solar junction box comprising:
   a housing having a base and a cover coupled to the base, the base and the cover defining a cavity, the base having a mounting wall including a mounting surface configured to be mounted to the solar panel, the mounting wall including a foil opening at the mounting surface; and
   a contact assembly received in the cavity, the contact assembly having a terminal including a foil contact configured to be terminated to the foil, the foil contact having a transition leg transitioning out of the cavity into the foil opening to interface with the foil, the foil contact having a mating leg configured to be mated with the foil exterior of the cavity, the mating leg extending at or beyond the mounting wall.

2. The solar junction box of claim 1, wherein the mating leg extends at or beyond the mounting surface.

3. The solar junction box of claim 1, wherein at least one of the transition leg and the mating leg extends out of the cavity through the mounting wall.

4. The solar junction box of claim 1, wherein at least one of the transition leg and the mating leg extends exterior of the housing.

5. The solar junction box of claim 1, wherein the mating leg includes a weld pad configured to be welded to the foil.

6. The solar junction box of claim 1, wherein the mating leg extends to the solar panel.

7. The solar junction box of claim 1, wherein the mounting wall includes an inner surface opposite the mounting surface, the inner surface defining the cavity, the mating leg extending beyond the inner surface.

8. The solar junction box of claim 1, wherein the terminal includes a terminating contact opposite the foil contact, the terminating contact being terminated to a cable.

9. The solar junction box of claim 1, wherein the terminal includes a protection device contact opposite the foil contact, the protection device contact being electrically connected to a protection device in the cavity.

10. The solar junction box of claim 1, wherein the contact assembly comprises a second terminal in the cavity, the second terminal having a second foil contact terminated to a corresponding foil.

11. The solar junction box of claim 1, wherein the contact assembly comprises a second terminal in the cavity, the second terminal being electrically connected to the terminal via a protection device.

12. The solar junction box of claim 1, wherein the foil contact includes a spring beam including at least one of the transition leg and the mating leg, the mating leg being configured to be spring biased against the foil.

13. The solar junction box of claim 1, wherein the cover includes an opening open to the cavity, the opening configured to receive potting material to at least partially fill the cavity with potting material.

14. The solar junction box of claim 1, wherein the housing includes a plug boss configured to receive an electrical plug, the terminal being electrically coupled to the electrical plug.

15. A solar junction box for a solar panel having at least one photovoltaic cell and a foil electrically connected to the at least one cell, the solar junction box comprising:
   a housing having a base and a cover coupled to the base, the base and the cover defining a cavity, the base having a mounting wall including a mounting surface configured to be mounted to the solar panel, the mounting wall including a foil opening at the mounting surface; and
   a contact assembly received in the cavity, the contact assembly having a first terminal, a second terminal and a protection device electrically connected between the first and second terminals, the first terminal including a foil contact configured to be terminated to the foil, the foil contact having a transition leg transitioning out of the cavity into the foil opening to interface with the foil, the foil contact having a mating leg configured to be mated with the foil exterior of the cavity, the mating leg being at or beyond the mounting wall.

16. The solar junction box of claim 15, wherein the mating leg extends at or beyond the mounting surface.

17. The solar junction box of claim 15, wherein at least one of the transition leg and the mating leg extends out of the cavity through the mounting wall.

18. The solar junction box of claim 15, wherein the second terminal includes a foil contact configured to be terminated to the foil, the foil contact having a transition leg transitioning into the foil opening to interface with the foil, the foil contact having a mating leg configured to be mated with the foil, the mating leg being at or beyond the mounting wall.

19. A solar junction box for a solar panel having at least one photovoltaic cell and a foil electrically connected to the at least one cell, the foil being exposed through a panel opening in the solar panel, the solar junction box comprising:
   a housing having a base and a cover coupled to the base, the base and the cover defining a cavity, the base having a mounting wall including a mounting surface configured to be mounted to the solar panel, the mounting wall including a foil opening at the mounting surface; and
   a contact assembly received in the cavity, the contact assembly having a terminal including a foil contact configured to be terminated to the foil, the foil contact having a transition leg transitioning out of the cavity into the foil opening to interface with the foil, the foil contact having a mating leg configured to be mated with the foil, the mating leg configured to extend into the panel opening in the panel for termination to the foil exterior of the cavity.

20. The solar junction box of claim 19, wherein the mating leg is located exterior of the housing.

* * * * *